US012721113B2

(12) United States Patent
Hong et al.

(10) Patent No.: US 12,721,113 B2
(45) Date of Patent: Aug. 25, 2026

(54) SILVER NANOWIRE THIN-FILM PATTERNING METHOD

(71) Applicant: Seoul National University R&DB Foundation, Seoul (KR)

(72) Inventors: Yongtaek Hong, Seoul (KR); Jongjang Park, Suwon-si (KR); Geonhee Kim, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 894 days.

(21) Appl. No.: 17/254,261

(22) PCT Filed: Jun. 26, 2019

(86) PCT No.: PCT/KR2019/007716
§ 371 (c)(1),
(2) Date: Dec. 18, 2020

(87) PCT Pub. No.: WO2020/045808
PCT Pub. Date: Mar. 5, 2020

(65) Prior Publication Data
US 2021/0272795 A1 Sep. 2, 2021

(30) Foreign Application Priority Data
Aug. 31, 2018 (KR) ........................ 10-2018-0103875

(51) Int. Cl.
*H10P 76/00* (2026.01)
*H05K 1/02* (2006.01)
*H05K 3/12* (2006.01)

(52) U.S. Cl.
CPC ........... *H10P 76/00* (2026.01); *H05K 1/0209* (2013.01); *H05K 3/125* (2013.01); *H05K 2201/0108* (2013.01); *H05K 2201/026* (2013.01)

(58) Field of Classification Search
CPC ...................................................... H05K 3/125
See application file for complete search history.

(56) References Cited

U.S. PATENT DOCUMENTS 7,195,733 B2 * 3/2007 Rogers .................. B82Y 10/00 264/496
8,094,247 B2 1/2012 Allemand et al.
(Continued)

FOREIGN PATENT DOCUMENTS

JP 2010-517809 A 5/2010
KR 10-2013-0067181 A 6/2013
(Continued)

OTHER PUBLICATIONS

Photonis. What's corona discharge? May 8, 2022. Photonis. https://www.photonis.com/news/whats-corona-discharge#:~:text=A%20corona%20discharge%20occurs%20when,the%20molecules%20of%20neutral%20gases. (Year: 2022).*
(Continued)

*Primary Examiner* — Dah-Wei D. Yuan
*Assistant Examiner* — Kristen A Dagenais

(57) ABSTRACT

Disclosed is a silver nanowire patterning method including patterning an adhesive conductive polymer thin-film on a substrate, fabricating a polydimethylsiloxane (PDMS) stamp coated with a silver nanowire thin-film, and bonding the substrate patterned with the conductive polymer thin-film to the PDMS stamp coated with the silver nanowire thin-film and then separating the two bonded substrates.

19 Claims, 5 Drawing Sheets

(56) References Cited

U.S. PATENT DOCUMENTS

| | | | | |
|---|---|---|---|---|
| 2009/0129004 | A1* | 5/2009 | Gruner | H10F 77/244 174/250 |
| 2013/0056244 | A1* | 3/2013 | Srinivas | H05K 1/0298 174/250 |
| 2019/0056244 | A1* | 2/2019 | Elliott | H05K 1/165 |

FOREIGN PATENT DOCUMENTS

| | | | |
|---|---|---|---|
| KR | 10-1375657 | B1 | 3/2014 |
| KR | 10-2014-0124239 | A | 10/2014 |
| KR | 10-2016-0098643 | A | 8/2016 |

OTHER PUBLICATIONS

International Search Report mailed Oct. 1, 2019 for International Application No. PCT/KR2019/007716 and its English translation.

Sung-Eun Park et al., "Fabrication of silver nanowire transparent electrodes using electrohydrodynamic spray deposition for flexible organic solar cells", J. Mater. Chem. A, 2013, vol. 1, pp. 14286-14293.

* cited by examiner

SILVER NANOWIRE THIN-FILM PATTERNING METHOD

CROSS-REFERENCE TO RELATED APPLICATION(S)

This application is a national stage entry of International Application No. PCT/KR2019/007716, filed on Jun. 26, 2019, which claims priority from Korean Patent Application No. 10-2018-0103875, filed on Aug. 31, 2018, in the Korean Intellectual Property Office, the disclosures of which are incorporated herein by reference in their entirety.

BACKGROUND

1. Field

The following description relates to a simple silver nanowire patterning method.

2. Description of Related Art

Conventionally, methods such as photolithography, laser ablation, and shadow-mask-based solution coating are used to perform silver nanowire thin-film patterning.

Related Document 1 (U.S. Patent Publication No. U.S. Pat. No. 8,094,247) and Related Document 2 (S. Park et al, "*Journal of Materials Chemistry A,*" 1, 14286-14293, 2013) disclose a technique of forming a silver nanowire electrode that is transparent and that has high conductivity and excellent mechanical properties in order to replace an indium tin oxide (ITO) transparent electrode having weak mechanical properties. In detail, Related Document 1 discloses a photolithography method for patterning a formed electrode, and Related Document 2 discloses a method of placing a predesigned shadow mask on a substrate and apply spray coating thereto in order to pattern a formed electrode.

However, all of the methods disclosed in the above-described related documents are complicated and expensive and have a highly limited degree of freedom of patterning in a facility construction process and a processing process.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to a silver nanowire thin-film patterning method that can reduce cost because the method is not complicated in a facility construction process and a processing process.

The following description also relates to a silver nanowire thin-film patterning method capable of guaranteeing the degree of freedom of a pattern.

The following description also relates to a silver nanowire thin-film patterning method that may be used to form a flexible or stretchable electrode according to the characteristics of a substrate forming an electrode.

In one general aspect, there is provided a silver nanowire patterning method including patterning an adhesive conductive polymer thin-film on a substrate, fabricating a polydimethylsiloxane (PDMS) stamp coated with a silver nanowire thin-film, and bonding the substrate patterned with the conductive polymer thin-film to the PDMS stamp coated with the silver nanowire thin-film and then separating the two bonded substrates.

Other features and aspects will be apparent from the following detailed description, the drawings, and the claims.

Figure 1:
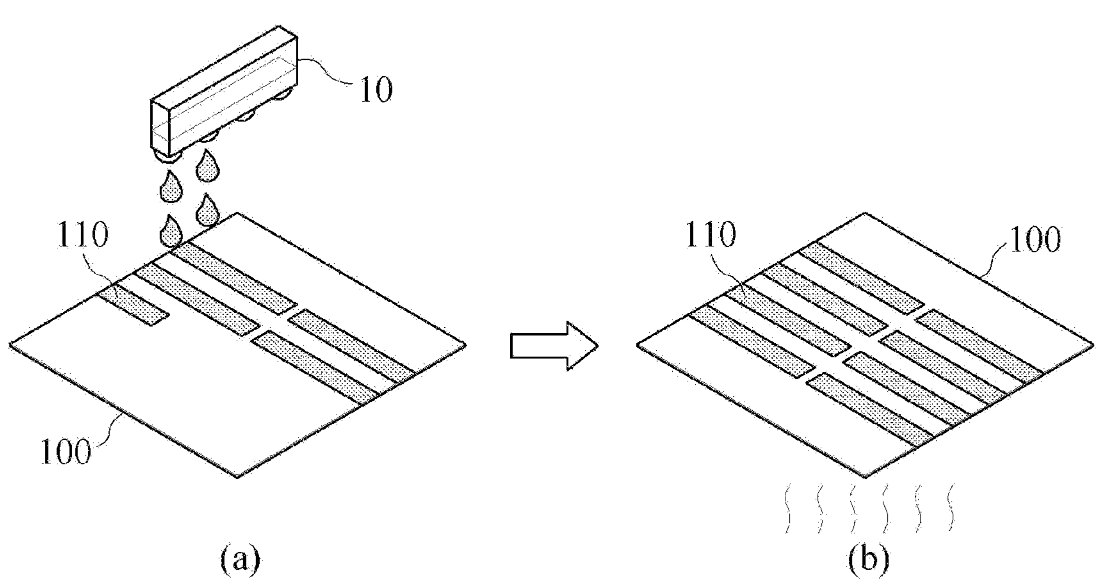
FIG. 1 is a diagram illustrating an operation of patterning an adhesive conductive polymer thin-film on a substrate according to an embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, exemplary embodiments of the present invention will be described in detail with reference to the accompanying drawings. Also, terms and words used herein are selected in consideration of the functions of the embodiments and may have meanings varying depending on the intent of the invention or a custom. Therefore, terms used in the following embodiments should be interpreted as specifically defined herein and should be interpreted as having meanings generally recognized by those skilled in the art when they are not specifically defined.

The present invention proposes a technique for simply fabricating a highly-conductive and transparent thin-film in various forms by freely patterning an adhesive conductive polymer on a substrate in a desired shape and transferring a silver nanowire onto a fabricated conductive polymer.

Figure 2:
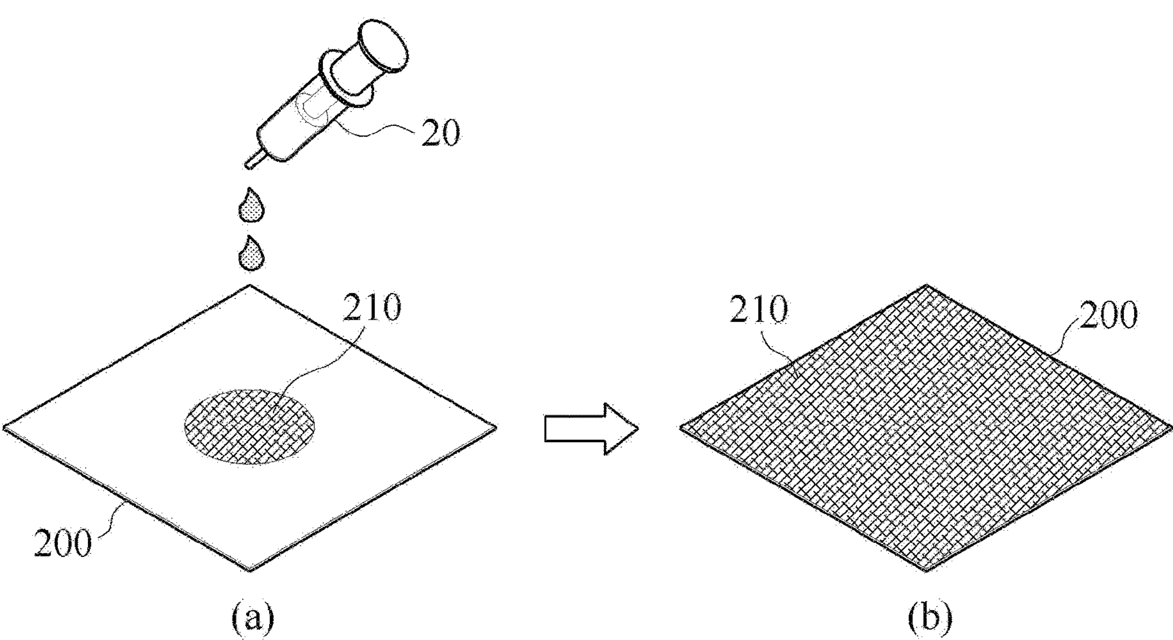
FIG. 2 is a diagram illustrating an operation of fabricating a polydimethylsiloxane (PDMS) stamp coated with a silver nanowire thin-film according to an embodiment of the present invention.
Figure 3:
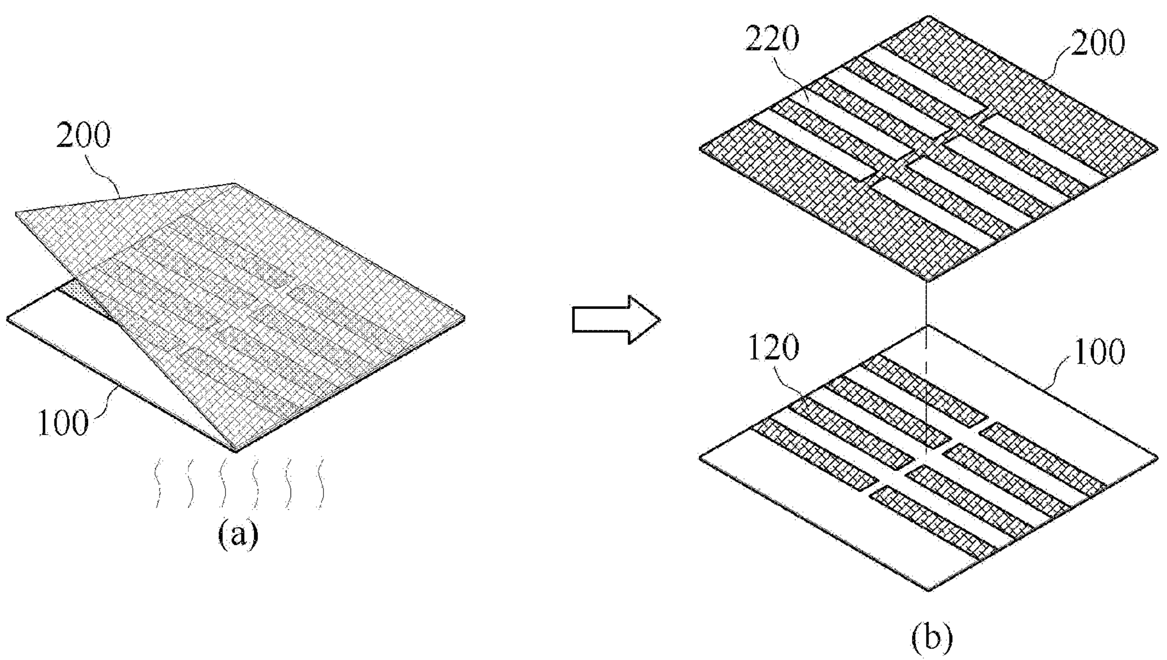
FIG. 3 is a diagram illustrating an operation of bonding a substrate patterned with a conductive polymer thin-film and a PDMS stamp coated with a silver nanowire thin-film and then separating the two bonded substrates.

FIGS. 1 to 3 are diagrams illustrating a silver nanowire patterning method in a process sequence according to an embodiment of the present invention.

As shown in FIGS. 1 to 3, the silver nanowire patterning method according to an embodiment of the present invention includes (A) patterning an adhesive conductive polymer thin-film on a substrate, (B) fabricating a polydimethylsiloxane (PDMS) stamp coated with a silver nanowire thin-film, and (C) bonding the substrate patterned with the conductive polymer thin-film and the PDMS stamp coated with the silver nanowire thin-film and separating the two bonded substrates.

FIG. 1 is a diagram showing an operation of patterning an adhesive conductive polymer thin-film on a substrate according to an embodiment of the present invention.

First, referring to FIG. 1, according to an embodiment of the present invention, an inkjet printing technique is used to form a conductive polymer thin-film with which patterning is performed and which is a medium for silver nanowire patterning. Specifically, inkjet printing is a technique of forming a pattern by spraying fine droplets of functional inks onto an adherend through a nozzle. Advantageously, inkjet printing, which is a kind of additive method, has a simple process, requires no special environment such as a vacuum, and generates no waste liquid during the process, unlike a subtractive method. Also, inkjet printing is a process of forming a thin film by printing inks of various materials on a substrate in a drop-on-demand (DOD) scheme. In particular, inkjet printing is based on a solution process and enables a process to be performed without a mask for patterning at room temperature and pressure. Thus, inkjet printing is a technique that has been spotlighted because various patterns can be formed in a cheap and simple manner compared to a conventional vacuum deposition scheme. A surface condition of a substrate to be formed, the properties of a solution in which a material is dissolved, reactivity with a substrate, and the like should be considered in order to obtain a high-quality thin film having a desired shape. An inkjet printing technique has been mainly developed in the field of flexible and stretchable devices that require a low-temperature process. However, the use of inkjet printing is just an embodiment, and the present invention is not limited thereto. That is, a variety of possible methods can be used to bond an adhesive conductive polymer thin film to a substrate in a predetermined form.

As shown in FIG. 1A, a conductive polymer thin-film 110 is printed on one surface of a substrate 100 using an inkjet printer. Here, a solution used by an inkjet printer cartridge 10 is a conductive polymer ink to which an adhesive material is added and is printed on the substrate 100 as a conductive polymer ink according to a pattern input to the inkjet printer. In this case, the printed pattern may be a pattern that may be used as a flexible or stretchable electrode according to the characteristics of a substrate forming the electrode.

Then, as shown in FIG. 1B, finally, the conductive polymer thin-film 110 printed on the substrate is obtained by performing thermal annealing on the substrate 100 on which the conductive polymer thin-film 110 is printed by the inkjet printer 10.

FIG. 2 is a diagram showing an operation of fabricating a PDMS stamp coated with a silver nanowire thin-film according to an embodiment of the present invention.

Subsequently, referring to FIG. 2, the present invention uses a technique of transferring a silver nanowire thin-film onto an adhesive conductive polymer thin-film. In detail, a transfer technique is a type of dry process and is a process of fabricating a thin film to be formed on a stamp first and then transferring the thin film onto a target substrate using a difference in adhesion between the thin film and the substrate. Accordingly, a method of supplementing a phenomenon in which an underlying layer is damaged or deformed by a solvent during a general solution process is being actively studied. In order for the transfer to occur effectively, not only the adhesion between the target substrate and the thin film to be formed but also a feature in which the thin film is well separated from the stamp should be considered. A transfer technique has been mainly developed in the field of fabricating highly-efficient solution-process-based devices by minimizing effects that may occur during solution processing through a drying process.

As shown in FIG. 2A, a silver nanowire (AgNW) solution 210 is applied onto one side of a PDMS stamp 200. Here, the PDMS stamp 200 is a plasma-treated substrate. Also, the AgNW solution 210 may be injected from an injector-type container onto the PDMS stamp 200.

When the AgNW solution 210 is applied onto one side of the PDMS stamp 200, spin coating is performed. Here, spin coating is a method of rotating an object to push out an arbitrary liquid placed on the object using a centrifugal force and thus to coat the object with the liquid and is a process of making a thin film. Since this spin coating has a high coating speed and excellent reproducibility, it is easy to adjust the thickness of the film, and general coating equipment can laminate the thin film without additional equipment. Furthermore, the surface of the thin film is even, and the thickness, hydrophilicity, absorbance, refractive index, etc. can be easily adjusted according to a polymer formation and technique.

Also, as shown in FIG. 2B, the PDMS stamp 200 entirely coated with the silver nanowire 210 is placed at room temperature to perform solvent evaporation. Then, through salt treatment, a silver nanowire thin-film with enhanced conductivity is finally obtained.

Figure 4:
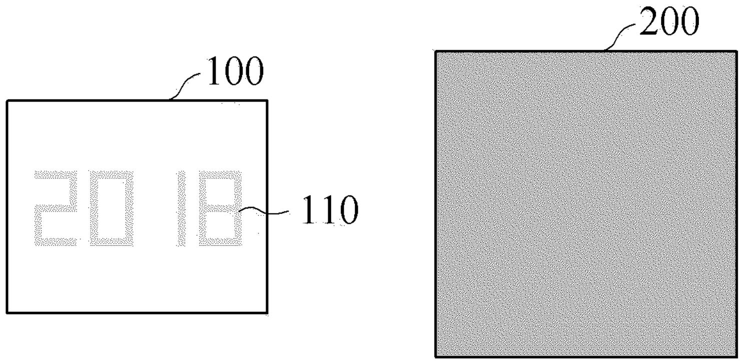
FIG. 4 is a diagram showing an example of a substrate patterned with a conductive polymer thin-film and a PDMS stamp coated with a silver nanowire thin-film according to the present invention.

FIG. 4 is a diagram showing an example of a substrate patterned with a conductive polymer thin-film and a PDMS stamp coated with a silver nanowire thin-film according to the present invention.

Referring to FIG. 4, a substrate 100 on which a conductive polymer thin-film 110 is formed and a PDMS stamp 200 on which a silver nanowire thin-film is formed is shown as an example. Conductive polymer thin-film 110 is finely printed on the substrate 100, on which the conductive polymer thin-film is formed, in the pattern of the numbers "2018."

FIG. 3 is a diagram illustrating an operation of bonding a substrate patterned with a conductive polymer thin-film and a PDMS stamp coated with a silver nanowire thin-film and then separating the two bonded substrates.

Referring to FIG. 3A, a substrate 100 on which a conductive polymer thin-film is formed and a PDMS stamp 200 on which a silver nanowire thin-film is formed, which are formed using the operations illustrated in FIGS. 1 and 2, are bonded to each other. Then, the bonded substrate 100 and PDMS stamp 200 are heated for a certain period of time and then are cooled.

Referring to FIG. 3B, when the temperature of the bonded substrate 100 and PDMS stamp 200 decreases to room temperature, the two substrates 100 and 200 are separated from each other. Looking at the separated substrate 100 and PDMS stamp 200, it can be seen that the silver nanowire 210 applied onto the PDMS stamp 200 is detached from a pattern position 220 at which the conductive polymer thin-film of the substrate 100 is printed. The silver nanowire 210 detached from the PDMS stamp 200 is attached 120 to a pattern of the substrate 100 on which the conductive polymer thin-film is printed. Accordingly, a silver nanowire thin-film with which patterning is performed is obtained in a desired form.

Figure 5:
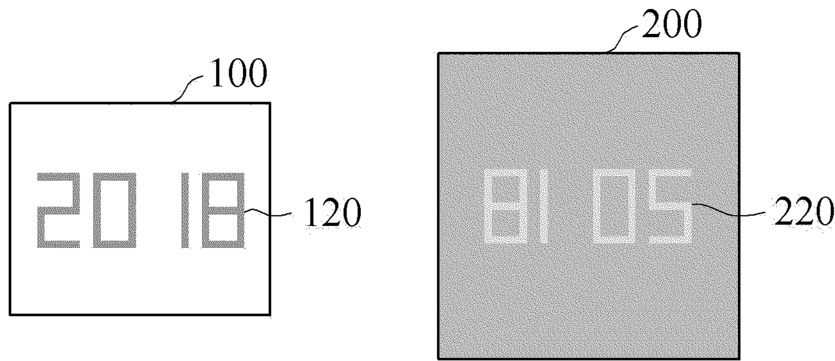
FIG. 5 is a diagram showing an example of a silver nanowire thin-film with which patterning is performed after a silver nanowire is transferred according to the present invention.

FIG. 5 is a diagram showing an example of a silver nanowire thin-film with which patterning is performed after a silver nanowire is transferred according to the present invention.

Referring to FIG. 5, a clear pattern is shown by attaching the silver nanowire 220 detached from the PDMS stamp 200 onto the adhesive conductive polymer thin-film pattern of the numbers "2018" of the substrate 100 shown in FIG. 4.

As described above, free patterning with conductive polymer is possible due to the inherent advantages of inkjet printing, and silver nanowire transfer occurs only on an adhesive conductive polymer thin-film. Thus, it is possible to assign process simplicity to the silver nanowire patterning and increase the degree of freedom.

Therefore, according to the present invention, silver nanowire patterning have a high degree of freedom is possible with a simple and inexpensive process compared to a conventionally reported method. That is, it is possible to freely and easily fabricate a silver nanowire thin-film having a desired shape on various substrates.

Also, depending on the required purpose, it is possible to freely adjust the transparency and conductivity of the thin film by adjusting the concentration of the nanowire with which the stamp is coated so that electrodes having various specifications can be fabricated. Also, depending on the field to which an electrode is to be applied, the electrode may be fabricated on a flexible or stretchable substrate. The electrode has similar electrical and optical characteristics but has excellent mechanical characteristics compared to ITO, which is widely used as a transparent electrode. Thus, the electrode is expected to be used as a next-generation transparent electrode applicable to flexible or stretchable devices. For example, the present invention has various application ranges including electronic devices such as flexibility- or stretchability-based organic light emitting diodes (OLED), organic solar cells (OSC), and touch panels.

The present invention has been described above with reference to embodiments referring to the accompanying drawings, but is not limited thereto. Rather, the present invention should be construed as encompassing various modifications that may be apparent to those skilled in the art. The appended claims are intended to cover such modifications.

What is claimed is:

1. A silver nanowire patterning method comprising:

forming a pattern of an adhesive conductive polymer thin-film on a substrate;

fabricating a polydimethylsiloxane (PDMS) stamp having a bottom surface coated with a silver nanowire thin-film; and bonding the substrate patterned with the conductive polymer thin-film to the PDMS stamp having the bottom surface coated with the silver nanowire thin-film and then separating the substrate from the PDMS stamp, wherein the forming of the pattern comprises printing the pattern of the adhesive conductive polymer thin-film onto the substrate using an inkjet printer, and wherein, after separation of the substrate from the PDMS stamp, at least a part of the silver nanowire thin-film is attached to the pattern of the conductive polymer thin-film on the substrate, wherein the bottom surface of the PDMS stamp is planar and entirely coated with the silver nanowire thin-film when bonding the substrate to the PDMS stamp.

2. The silver nanowire patterning method of claim 1, wherein the patterning comprises forming, on the substrate, a pattern to be used as a flexible or stretchable element.

3. The silver nanowire patterning method of claim 1, wherein the forming the pattern further comprises performing thermal annealing after the conductive polymer thin-film is printed onto the substrate.

4. The silver nanowire patterning method of claim 1, wherein the fabricating comprises:

applying a silver nanowire onto a plasma-treated PDMS substrate;

performing spin coating; and performing solvent evaporation at room temperature and then performing salt treatment.

5. The silver nanowire patterning method of claim 1, wherein the bonding and separation of the substrate from the PDMS stamp comprises bonding the substrate patterned with the conductive polymer thin-film to the PDMS stamp coated with the silver nanowire thin-film, heating the substrate, and then cooling the substrate.

6. The silver nanowire patterning method of claim 1, wherein, after separation of the substrate from the PDMS stamp, at least a part of the bottom surface of the PDMS stamp is not coated with the silver nanowire thin-film.

7. The silver nanowire patterning method of claim 1, wherein the bonding is performed subsequent to the forming of the pattern and the fabricating.

8. The silver nanowire patterning method of claim 1, wherein the bottom surface of the PDMS stamp to which the substrate patterned with the conductive polymer thin-film is to be bonded, after the fabrication of the PDMS stamp and before bonding, is entirely coated with the silver nanowire thin-film.

9. The silver nanowire patterning method of claim 5, wherein the heating is performed while the substrate is bonded to the PDMS stamp, and the substrate is separated from the PDMS stamp when the PDMS stamp and the substrate reach room temperature.

10. A silver nanowire patterning method comprising:

forming a pattern of an adhesive conductive polymer thin-film on a substrate;

fabricating a polydimethylsiloxane (PDMS) stamp having a bottom surface coated with a silver nanowire thin-film; and bonding the substrate patterned with the conductive polymer thin-film to the bottom surface of the PDMS stamp coated with the silver nanowire thin-film and then separating the substrate from the PDMS stamp, wherein the forming of the pattern comprises printing the pattern of the adhesive conductive polymer thin-film onto the substrate using an inkjet printer, wherein, after separation of the substrate from the PDMS stamp, at least a part of the silver nanowire thin-film is attached to the pattern of the conductive polymer thin-film on the substrate, wherein the bottom surface of the PDMS stamp is planar and entirely coated with the silver nanowire thin-film when bonding the substrate to the PDMS stamp, and wherein the silver nanowire detached from the PDMS stamp is attached only to the pattern of the substrate on which the conductive polymer thin-film is printed.

11. The silver nanowire patterning method of claim 10, wherein the patterning comprises forming, on the substrate, a pattern to be used as a flexible or stretchable element.

12. The silver nanowire patterning method of claim 10, wherein the forming the pattern further comprises performing thermal annealing after the conductive polymer thin-film is printed onto the substrate.

13. The silver nanowire patterning method of claim 10, wherein the fabricating comprises:

applying a silver nanowire onto a plasma-treated PDMS substrate;

performing spin coating; and performing solvent evaporation at room temperature and then performing salt treatment.

14. The silver nanowire patterning method of claim 10, wherein the bonding and separation of the substrate from the PDMS stamp comprises bonding the substrate patterned with the conductive polymer thin-film to the PDMS stamp coated with the silver nanowire thin-film, heating the substrate, and then cooling the substrate.

15. The silver nanowire patterning method of claim 10, wherein in fabricating the PDMS stamp, the silver nanowire thin-film is formed evenly on the bottom surface of the PDMS stamp.

16. The silver nanowire patterning method of claim 10, wherein in fabricating the PDMS stamp, the silver nanowire thin-film is formed on the bottom surface of the PDMS stamp with a uniform thickness.

17. The silver nanowire patterning method of claim 1, wherein in fabricating the PDMS stamp, the silver nanowire thin-film is formed evenly on the bottom surface of the PDMS stamp.

18. The silver nanowire patterning method of claim 10, wherein in fabricating the PDMS stamp, the silver nanowire thin-film is formed on the bottom surface of the PDMS stamp with a uniform thickness.

19. The silver nanowire patterning method of claim 1, wherein the bottom surface of the PDMS stamp is planar and entirely coated with the silver nanowire thin-film when bonding a surface of the substrate directly to the bottom surface of the PDMS stamp.

* * * * *